United States Patent
Schertel (10) Patent No.: US 9,455,120 B2
(45) Date of Patent: Sep. 27, 2016

(54) PARTICLE BEAM DEVICE AND METHOD FOR PROCESSING AND/OR ANALYZING A SAMPLE

(75) Inventor: Andreas Schertel, Aalen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 14 days.

(21) Appl. No.: 13/345,077

(22) Filed: Jan. 6, 2012

(65) Prior Publication Data

US 2012/0205538 A1 Aug. 16, 2012

(30) Foreign Application Priority Data

Jan. 12, 2011 (DE) .................. 10 2011 002 583

(51) Int. Cl.
  *H01J 37/30* (2006.01)
  *H01J 37/302* (2006.01)
  *H01J 37/305* (2006.01)

(52) U.S. Cl.
  CPC ........ *H01J 37/3005* (2013.01); *H01J 37/3056* (2013.01); *H01J 2237/20207* (2013.01); *H01J 2237/30466* (2013.01); *H01J 2237/31749* (2013.01)

(58) Field of Classification Search
  CPC .............. H01J 2237/202; H01J 2237/20207; H01J 2237/20214; H01J 2237/20221; H01J 2237/20228; H01J 2237/20235; H01J 2237/20278; H01J 2237/20285; H01J 2237/20292; H01J 37/20; H01J 37/21
  USPC ....................................... 250/307
  See application file for complete search history.

(56) References Cited

U.S. PATENT DOCUMENTS

| 5,574,280 | A  | * | 11/1996 | Fujii et al. ..................... 850/63 |
| 8,796,651 | B2 | * | 8/2014 | Shichi et al. .............. 250/492.3 |
| 2005/0086946 | A1 | * | 4/2005 | Song et al. ..................... 62/3.2 |
| 2005/0116165 | A1 |  | 6/2005 | Kienle et al. |
| 2006/0226376 | A1 | * | 10/2006 | Fujii ....................... 250/492.21 |
| 2007/0125958 | A1 |  | 6/2007 | Tappel et al. |
| 2008/0073586 | A1 | * | 3/2008 | Iwasaki ................... 250/492.21 |
| 2008/0202920 | A1 | * | 8/2008 | Iwaya et al. ............ 204/192.34 |
| 2008/0296498 | A1 |  | 12/2008 | Hong |
| 2008/0302961 | A1 | * | 12/2008 | Tashiro et al. ................ 250/310 |
| 2008/0315088 | A1 | * | 12/2008 | Takahashi et al. .......... 250/306 |

(Continued)

FOREIGN PATENT DOCUMENTS

| DE | 103 51 276 A1 | 6/2005 |
| DE | 10 2007 026 847 A1 | 12/2008 |
| DE | 10 2008 041 815 A1 | 4/2010 |
| EP | 1 443 541 A2 | 8/2004 |
| EP | 1 998 356 A2 | 12/2008 |

(Continued)

*Primary Examiner* — Wyatt Stoffa
*Assistant Examiner* — Sean Luck
(74) *Attorney, Agent, or Firm* — Muirhead and Saturnelli, LLC (57) ABSTRACT

A particle beam device and method for processing and/or for analyzing a sample are provided. A sample carrier is arranged at a first position, in which a sample surface is oriented parallel to a first beam axis of a first particle beam column. The sample carrier is rotatable from the first position into a second position, in which the sample surface is oriented perpendicular to a second beam axis of a second particle beam column. The first and second beam axes intersect at a coincidence point. In the first position a distance between the coincidence point and the first particle beam column is greater than a distance between the sample surface and the first particle beam column. In the second position a distance between the coincidence point and the second particle beam column is greater than a distance between the sample surface and the second particle beam column.

19 Claims, 4 Drawing Sheets

(56) References Cited

U.S. PATENT DOCUMENTS

2009/0014648 A1 1/2009 Zeile et al.
2009/0251091 A1* 10/2009 Fujita et al. .................. 318/594
2010/0059672 A1 3/2010 Zeile
2012/0112064 A1 5/2012 Nagakubo et al.

FOREIGN PATENT DOCUMENTS

| EP | 1 998 356 B1 | 7/2010 |
| JP | 2007129214 A | 5/2007 |
| JP | 2009014709 A | 1/2009 |
| JP | 2010257617 A | 11/2010 |

* cited by examiner

PARTICLE BEAM DEVICE AND METHOD FOR PROCESSING AND/OR ANALYZING A SAMPLE

TECHNICAL FIELD

This application relates to a particle beam device and a method which are designed for processing and/or for analyzing (examining) a sample. In particular, this application relates to an electron beam device and/or an ion beam device.

BACKGROUND OF THE INVENTION

Electron beam devices, in particular a scanning electron microscope (SEM) or a transmission electron microscope (TEM), are used for examining samples in order to obtain insights with regard to the properties and behavior of said samples under specific conditions.

In the case of an SEM, an electron beam (also called primary electron beam hereinafter) is generated using a beam generator. The electrons of the primary electron beam are accelerated to a predeterminable energy and focused by a beam guiding system, in particular an objective lens, onto a sample to be analyzed (that is to say an object to be analyzed). A high-voltage source having a predeterminable acceleration voltage is used for acceleration purposes in the case of the SEM. Using a deflection device, the primary electron beam is guided in a raster-type fashion over a surface of the sample to be analyzed. In this case, the electrons of the primary electron beam interact with the material of the sample to be analyzed. In particular, interaction particles and/or interaction radiation arise(s) as a consequence of the interaction. By way of example, electrons are emitted by the sample to be analyzed (so-called secondary electrons) and electrons with the primary electron beam are backscattered at the sample to be analyzed (so-called backscattered electrons). The secondary electrons and backscattered electrons are detected and used for image generation. An imaging of the sample to be analyzed is thus obtained.

An imaging of a sample to be analyzed is one possible form of analysis of the sample to be analyzed. However, further forms of analysis are indeed known. By way of example, the interaction radiation (for example X-ray radiation or cathodoluminescent light) is detected and evaluated in order to obtain conclusions about the composition of the sample to be analyzed.

Furthermore, it is known from the prior art to use combination devices for processing and/or for analyzing a sample, wherein both electrons and ions can be guided onto a sample to be processed and/or to be analyzed. By way of example, it is known for an SEM to be additionally equipped with an ion beam column. Using an ion beam generator arranged in the ion beam column, ions are generated which are used for processing a sample (for example for removing a layer of the sample or for applying material to the sample) or else for imaging. In this case, the SEM serves, in particular, for observing the processing, but also for further analysis of the processed or non-processed sample.

Furthermore, the prior art discloses a particle beam device having a first particle beam column having a first beam axis, wherein the first particle beam column is designed for generating a first particle beam. In addition, the known particle beam device has a second particle beam column, which is provided with a second beam axis and which is designed for generating a second particle beam. The first particle beam column and the second particle beam column are arranged with respect to one another in such a way that the first beam axis and the second beam axis form a first angle of approximately 50°. Furthermore, the known particle beam device has a sample carrier, which is rotatable about a rotation axis. The rotation axis runs through the center of the sample carrier. Furthermore, the rotation axis forms a second angle with the first beam axis and a third angle with the second beam axis. At the sample carrier, a sample can be arranged on a sample holder, wherein the sample has a sample surface to be processed and/or to be analyzed. The sample holder extends along the rotation axis. The sample surface has a surface normal that forms a fourth angle with the rotation axis.

With regard to the prior art, reference is made for example to DE 10 2008 041 815 A1, DE 10 2007 026 847 A1 and EP 1 443 541 B1, which are incorporated herein by reference.

With the known particle beam devices from the prior art, by way of example, series examinations are carried out on a sample. This is understood to mean, in particular, that the sample surface of a sample is firstly processed with the first particle beam in a first step. By way of example, material of the sample surface is removed or material is applied to the sample surface. In order to process the sample surface, the sample carrier is brought into a first position relative to the first particle beam column. Afterward, the sample surface is processed with the first particle beam. In a second step, the processed sample surface is analyzed using the second particle beam. For this purpose, the sample carrier is brought into a second position relative to the second particle beam column. Afterward, the processed sample surface is analyzed. By way of example, the processed sample surface is imaged using the second particle beam. In general, the sample surface in the second position of the sample carrier is oriented with respect to the second beam axis in such a way that a coincidence point lies in the plane of the sample surface. The coincidence point is a point at which the first beam axis and the second beam axis intersect. In the second position, the sample surface to be analyzed using the second particle beam is arranged in inclined fashion with respect to the second beam axis.

During the series examination, provision is then made for carrying out a multiple change between the first step and the second step. In order to obtain a sufficiently good analysis of the sample surface, in particular an imaging of the processed sample surface with a high resolution capability, in general the sample carrier in the second position has to be moved closer to the second particle beam column and the second particle beam has to be focused again onto the processed sample surface. As a result of this, however, the series examination on the sample becomes time-consuming.

Therefore, it would be desirable to address the problem of specifying a particle beam device and to enable a series examination on a sample in a simple and rapid manner.

SUMMARY OF THE INVENTION

The particle beam device according to the system described herein has at least one first particle beam column which is provided with a first beam axis. The first particle beam column is designed for generating a first particle beam. Furthermore, the particle beam device according to the system described herein has at least one second particle beam column which is provided with a second beam axis and which is designed for generating a second particle beam. The first particle beam column and the second particle beam column are arranged with respect to one another in such a way that the first beam axis and the second beam axis form a first angle, which is different from 0° and 180°. Accordingly, the first beam axis and the second beam axis are not arranged parallel to one another. Rather, the first particle beam column (and thus the first beam axis) and the second particle beam column (and thus the second beam axis) are arranged in inclined fashion with respect to one another. By way of example, the first particle beam column and the second particle beam column are arranged on a sample chamber of the particle beam device according to the system described herein.

The particle beam device according to the system described herein has at least one sample carrier which is rotatable about a rotation axis. The rotation axis forms a second angle with the first beam axis. Furthermore, the rotation axis forms a third angle with the second beam axis. Both the second angle and the third angle are different from 0° and 180°. To put it another way, the rotation axis is not oriented parallel either to the first beam axis or to the second beam axis. Rather, the sample carrier is arranged in the particle beam device in such a way that the rotation axis is arranged in a manner inclined with respect to the first beam axis by a specific angle (second angle) and in a manner inclined with respect to the second beam axis by a specific angle (third angle). Furthermore, provision is made, for example, for the rotation axis to be arranged perpendicular to a sample carrier surface and/or to run through a center of the sample carrier. At least one sample can be arranged on the sample carrier. In particular, provision is made for the sample to have a sample surface to be processed and/or to be analyzed.

The sample carrier of the particle beam device according to the system described herein is arranged at a first position or rotatable into a first position, in which the sample surface of a sample which can be arranged on the sample carrier is oriented parallel or substantially parallel to the first beam axis. By way of example, deviations of a few degrees, for example up to 5°, from complete parallelism are provided. Furthermore, the sample carrier is rotatable from the first position into a second position, in which the sample surface is oriented perpendicular or substantially perpendicular to the second beam axis. By way of example, deviations of a few degrees, for example up to 5°, from complete perpendicular orientation are provided.

The first beam axis and the second beam axis of the particle beam device according to the system described herein intersect at a coincidence point. However—in contrast to the prior art—provision is now made for the sample surface of the sample in the first position of the sample carrier to be oriented in such a way that the coincidence point lies in a first plane, which is different from the sample surface and which is arranged perpendicular to the first beam axis. Furthermore, provision is made for the sample surface of the sample in the second position of the sample carrier to be oriented in such a way that the coincidence point lies in a second plane, which is different from the sample surface and which is arranged perpendicular to the second beam axis. Furthermore, provision is made for the distance between the sample surface and a first end of the first particle beam column in the first position of the sample carrier (also called the first working distance hereinafter) to be less than the distance between the coincidence point and the first end of the first particle beam column. Furthermore, provision is made for the distance between the sample surface and a second end of the second particle beam column in the second position of the sample carrier (also designated as the second working distance hereinafter) to be less than the distance between the coincidence point and the second end of the second particle beam column.

The system described herein is based on the following consideration.

The particle beam device according to the system described herein provides, then, for the sample surface of the sample to be processed using the first particle beam in the first position. By way of example, in the first position material is removed from the sample surface or material is applied to the sample surface. Afterward, the sample carrier is brought from the first position into the second position, in which the sample surface is oriented perpendicular to the second beam axis. This is done by rotation of the sample carrier about the rotation axis. In the second position the processed sample surface is analyzed using the second particle beam. In particular, provision is made for imaging the processed sample surface. Since the sample surface in the second position is oriented perpendicular to the second beam axis and, moreover, the second working distance is less than a comparable working distance in a particle beam device from the prior art (wherein the comparable working distance is basically the distance between the second end of the second particle beam column and the coincidence point), good imaging properties can be obtained. In this case, the system described herein has the advantage that, using a single movement of the sample carrier, namely the rotation of the sample carrier from the first position into the second position about the rotation axis, the sample surface of the sample can be oriented perpendicular to the second beam axis. Further movements are not absolutely necessary.

The system described herein is not restricted to an imaging as a type of analysis. Rather, any type of analysis can be used in which a particle beam is employed, for example an analysis of cathodoluminescence and/or of x-ray radiation.

The configuration of the particle beam device according to the system described herein makes it possible, in particular, to choose the first working distance and/or the second working distance to be small in comparison with the prior art. Specifically, the system described herein provides for performing a processing and/or an analysis of the sample surface of the sample not at the coincidence point, but rather at points which are arranged significantly closer to the first particle beam column and/or the second particle beam column than the coincidence point. As a result of this, a good resolution capability is obtained particularly in the second position during an imaging of the sample surface using the second particle beam. By way of example, the first working distance is in the range of 0.5 mm to 12 mm, wherein the range limits of this range are concomitantly encompassed thereby. In particular, approximately 0.7 mm can be chosen as the first working distance. Furthermore, provision is made, for example, for the second working distance to be in the range of 0.5 mm to 5 mm, wherein here too, the range limits of the aforementioned range are concomitantly encompassed thereby. In particular, approximately 1.5 mm can be chosen as the second working distance. It is explicitly pointed out that the abovementioned values of the first working distance and of the second working distance should be understood merely by way of example and not in a restrictive manner. Rather, it is also possible to choose other values for at least one of the two working distances mentioned above.

On account of the smaller working distances possible in comparison with the prior art, the system described herein makes it possible that in the first position and/or in the second position of the sample carrier imagings can be performed in which lower acceleration voltages than in comparison with the prior art can be used for particles of the first particle beam and/or particles of the second particle beam. By way of example, acceleration voltages of less than 750 V are provided in the system described herein. This is possible only with difficulty in the prior art, which likewise has the second particle beam column, for imagings of a sample surface arranged at the coincidence point. In order to obtain good imaging properties in said prior art, acceleration voltages of greater than 750 V should be used for the particles of the second particle beam. This has the following background. The known prior art has, for focusing purposes, an objective lens provided both with electrostatic elements and with magnetic elements. The electrostatic elements are always operated with a constant voltage, even if the acceleration voltage can vary in a specific range (for example in a range of 100 V to 20 kV). On account of the electrostatic elements, the second particle beam is focused to working distances that are less than 10 mm. Using the magnetic elements, it is then only possible to set the second particle beam to working distances even smaller than 10 mm. In the case of this particle beam device known from the prior art it has been found that the second particle beam, at acceleration voltages of less than 700 V, can be set only to working distances which are less than 5 mm. However, this is far below the coincidence point, which is arranged at a distance of approximately 5 mm from the second particle beam column in the case of the prior art. Consequently, the second particle beam in the case of the known particle beam device is no longer focused onto the sample surface arranged at the coincidence point. This causes poorer, that is to say no sharp, imagings of the sample surface. By comparison with this prior art, the system described herein has the advantage that in the first position and/or in the second position of the sample carrier imagings can be performed in which lower acceleration voltages than in comparison with the prior art can be used for particles of the first particle beam and/or particles of the second particle beam.

If the sample both in the first position with its sample surface facing the first particle beam column is spaced apart to a lesser extent than the coincidence point from the sample-side end of the first particle beam column and in the second position with its sample surface facing the second particle beam column is spaced apart to a lesser extent than the coincidence point from the sample-side end of the second particle beam column, it is possible to operate both a first objective of the first particle beam column and a second objective of the second particle beam column with a shorter focal length than corresponds to the distance between the sample-side end of the first particle beam column and the coincidence point and the distance between the sample-side end of the second particle beam column and the coincidence point. As a result, it is possible to operate the objectives of both particle beam columns—or of at least that particle beam column which is used for analyzing the sample surface—with a focal length for which the particle beam columns focus the respective particle beam in the best possible manner, that is to say that the smallest possible particle probe is produced on the sample surface. The positioning of the sample carrier relative to the sample-side end of the first particle beam column and relative to the sample-side end of the second particle beam column can—taking account of the length of a sample holder which is accommodated on the sample carrier and by which the sample is to be accommodated on the sample carrier—be chosen such that a surface—facing the first particle beam column—of a sample accommodated on the sample carrier or using a sample holder on the sample carrier in the first position is situated in a position in which the particle probe generated by the first particle beam column has a smallest possible diameter and in the second position the surface of the sample is situated in a position in which the particle probe generated by the second particle beam column has a smallest possible diameter.

The system described herein is suitable, in particular, for a series examination on a sample. Consequently, the system described herein provides, after the conclusion of an analysis of the sample surface in the second position of the sample carrier, for the sample carrier to be brought into the first position again, such that the sample surface of the sample can be processed again. This is done by rotation of the sample carrier about the rotation axis from the second position into the first position. In the first position, using the first particle beam, by way of example, material is removed from the sample surface or material is applied to the sample surface. Afterward, the sample carrier is again brought into the second position, in which the sample surface that has been processed again is analyzed using the second particle beam. The system described herein has the advantage that a processing and an analysis of the sample in series is possible in a simple and rapid manner since the change between the first position and the second position can be effected only by a rotation of the sample carrier about the rotation axis.

In one embodiment of the system described herein, it is additionally or alternatively provided that the sample surface has a first surface normal. The first surface normal forms a fourth angle with the rotation axis, said fourth angle being different from 0° and 180°. To put it another way, the sample is arranged on the sample carrier in such a way that the sample surface is oriented in inclined fashion with respect to the rotation axis.

As already mentioned above, in a further embodiment of the particle beam device according to the system described herein, it is additionally or alternatively provided that the sample carrier is rotatable from the second position into the first position and/or from the first position into the second position. However, it is explicitly pointed out that the sample carrier is not only rotatable from the first position into the second position or from the second position into the first position, rather the system described herein also provides for the sample carrier to be able to be brought from an arbitrary position into the first position or the second position by a rotation of the sample carrier about the rotation axis.

In a further exemplary embodiment of the particle beam device according to the system described herein, it is additionally or alternatively provided that the sample is arranged on the sample carrier in a manner spaced apart from the rotation axis of the sample carrier, to be precise at a predeterminable distance from the rotation axis. It is thereby possible to define the first working distance and/or the second working distance. Considerations with regard to this embodiment have revealed, for example, that the first working distance and/or the second working distance are/is dependent on the distance between the sample (and thus also the sample surface) and the rotation axis. By way of example, it has been found that the first working distance and/or the second working distance are/is all the smaller, the further the sample is arranged from the rotation axis. By way of example, the sample is arranged at a distance in the range of approximately 2 mm to approximately 15 mm from the rotation axis, wherein the range limits are concomitantly encompassed. However, it is explicitly pointed out that the system described herein is not restricted to the abovementioned range and the values contained therein. Rather, any distance from the rotation axis can be chosen which is suitable for attaining a certain first working distance and a certain second working distance.

In yet another embodiment of the particle beam device according to the system described herein, it is additionally or alternatively provided that the particle beam device has a device for moving the sample carrier along the rotation axis. This means that the sample carrier is designed in such a way that it is arranged in movable fashion in the direction of the rotation axis in the particle beam device. Therefore, in addition to the possibility of rotating the sample carrier about the rotation axis, there is a possibility of a translational movement of the sample carrier along the rotation axis. This translational movement can be chosen for example depending on the processing of the sample surface. If, by way of example, material is applied to the sample surface or removed from the sample surface, the sample carrier is moved along the rotation axis in such a way that the sample surface in the second position of the sample carrier always has an identical second working distance. Consequently, it is not absolutely necessary to perform, for example, a refocusing of the second particle beam onto the sample surface after each processing of the sample surface. The same correspondingly applies to the first working distance, which can likewise always be identical on account of the movement of the sample carrier along the rotation axis.

In a further exemplary embodiment of the particle beam device according to the system described herein it is alternatively or additionally provided that at least one control device for controlling the device for moving the sample carrier along the rotation axis and/or for controlling the rotation of the sample carrier about the rotation axis is arranged on the particle beam device.

In a further exemplary embodiment of the particle beam device according to the system described herein, it is additionally or alternatively provided that the sample carrier has at least one sample holder. A receiving surface is arranged on the sample holder, the sample being arranged on said receiving surface. The receiving surface has a second surface normal, wherein the second surface normal forms a fifth angle with the rotation axis, said fifth angle being different from 0° and 180°. To put it another way, the second surface normal is not oriented parallel to the rotation axis. Consequently, the receiving surface is arranged in inclined fashion with respect to the rotation axis. In particular, it is additionally or alternatively provided that the receiving surface is also arranged in inclined fashion with respect to the sample carrier surface. In terms of absolute value, the fifth angle corresponds exactly to the third angle or to the fourth angle.

In a further exemplary embodiment of the particle beam device according to the system described herein, it is additionally or alternatively provided that the first surface normal and the second surface normal are oriented parallel to one another. To put it another way, the sample surface of the sample and the receiving surface of the sample holder are arranged parallel to one another.

In a further exemplary embodiment of the particle beam device according to the system described herein, it is additionally or alternatively provided that the particle beam device according to the system described herein has one of the following features:

the first angle is in the range of 15° to 80°;
the first angle is in the range of 30° to 70°; or
the first angle is in the range of 45° to 60°.

In this case, the range limits of the claimed range are concomitantly encompassed thereby. It is explicitly pointed out that the system described herein is not restricted to the abovementioned ranges of the first angle. Rather, the first angle can assume any suitable value.

In a further exemplary embodiment of the particle beam device according to the system described herein, it is additionally or alternatively provided that the particle beam device according to the system described herein has one of the following features:

the second angle is in the range of 45° to 160';
the second angle is in the range of 90° to 120°; or
the second angle is in the range of 100° to 110°.

Here, too, the range limits of the claimed range are concomitantly encompassed thereby. The system described herein is not restricted to the abovementioned ranges of the second angle. Rather, the second angle can assume any suitable value.

In yet another exemplary embodiment of the particle beam device according to the system described herein, it is additionally or alternatively provided that the particle beam device has one of the following features:

the third angle is in the range of 1° to 80°;
the third angle is in the range of 10° to 60°; or
the third angle is in the range of 15° to 30°.

Here once again the range limits of the claimed range are concomitantly encompassed thereby. The system described herein is not restricted to the abovementioned ranges of the third angle. Rather, the third angle can assume any suitable value.

In a further exemplary embodiment, it is provided that the third angle, that is to say the angle between the rotation axis of the sample carrier and the second beam axis, corresponds to half of the value by which the angle between the first beam axis and the second beam axis (that is to say the first angle) deviates from 90°. Correspondingly, the angle between the rotation axis and the first beam axis (that is to say the second angle) amounts to the sum of 90° and half of the value by which the angle between the two beam axes, that is to say the first beam axis and the second beam axis, deviates from 90°.

In a further exemplary embodiment of the particle beam device according to the system described herein, it is additionally or alternatively provided that the sample carrier and the sample holder are embodied in integral fashion. They accordingly form a unit. As an alternative thereto, it is provided that the sample holder and the sample carrier are embodied as separate units connected to one another in a suitable manner. By way of example, the sample holder is screwed to the sample carrier. However, it is explicitly pointed out that the system described herein is not restricted to this connection possibility. Rather, any connection possibility that is suitable can be used in the case of the system described herein.

In a further exemplary embodiment of the particle beam device according to the system described herein, the particle beam device according to the system described herein additionally or alternatively has one of the following features:

the first particle beam column is embodied as an ion beam column and the second particle beam column is embodied as an electron beam column;
the first particle beam column is embodied as an electron beam column and the second particle beam column is embodied as an ion beam column;
the first particle beam column is embodied as an electron beam column and the second particle beam column is embodied as an electron beam column; or the first particle beam column is embodied as an ion beam column and the second particle beam column is embodied as an ion beam column.

In yet another exemplary embodiment of the particle beam device according to the system described herein, it is additionally or alternatively provided that the first particle beam column has a first beam generator for generating a first particle beam and a first objective lens for focusing the first particle beam. In addition or as an alternative thereto it is provided that the second particle beam column has a second beam generator for generating a second particle beam and a second objective lens for focusing the second particle beam onto the sample.

In a further embodiment of the particle beam device according to the system described herein, it is provided that the particle beam device has at least one detection device for detecting interaction particles and/or interaction radiation, which arise as a result of interaction of the first particle beam and/or of the second particle beam with the sample.

The system described herein also relates to the further, following particle beam device, which can additionally be provided with at least one of the abovementioned features. The further particle beam device likewise has at least one first particle beam column which is provided with a first beam axis. The first particle beam column is designed for generating a first particle beam.

Furthermore, the particle beam device according to the system described herein has at least one second particle beam column which is provided with a second beam axis and which is designed for generating a second particle beam. The first particle beam column and the second particle beam column are arranged with respect to one another in such a way that the first beam axis and the second beam axis form a first angle, which is different from 0° and 180°. Accordingly, the first beam axis and the second beam axis are not arranged parallel to one another. By way of example, the first particle beam column and the second particle beam column are arranged on a sample chamber of the particle beam device according to the system described herein.

Furthermore, the particle beam device according to the system described herein has at least one sample carrier which is rotatable about a rotation axis. The rotation axis forms a second angle with the first beam axis. Furthermore, the rotation axis forms a third angle with the second beam axis. Both the second angle and the third angle are different from 0° and 180°. To put it another way, the rotation axis is not oriented parallel either to the first beam axis or to the second beam axis. Furthermore, provision is made, for example, for the rotation axis to be arranged perpendicular to a sample carrier surface and/or to run through a center of the sample carrier. At least one sample can be arranged on the sample carrier. In particular, provision is made for the sample to have a sample surface to be processed and/or to be analyzed.

The sample carrier of the particle beam device according to the system described herein is arranged at a first position or is rotatable into a first position, in which the sample surface of a sample which can be arranged on the sample carrier is oriented parallel or substantially parallel to the first beam axis. In this respect, reference is also made to further above. Furthermore, the sample carrier is rotatable from the first position into a second position, in which the sample surface is oriented perpendicular or substantially perpendicular to the second beam axis. Here, too, reference is made to further above. The first beam axis and the second beam axis of the particle beam device according to the system described herein intersect at a coincidence point.

The method according to the system described herein uses a particle beam device having at least one of the abovementioned features or a combination of at least two of the abovementioned features. The method according to the system described herein is designed for processing and/or for analyzing (examining) a sample. In this case, analyzing also encompasses the possibility of imaging the sample surface of the sample. Additional analysis possibilities may likewise be provided (see above). The method has the following steps:

rotating the sample carrier into the first position;
processing the sample surface using the first particle beam, wherein processing comprises, for example, removing material from the sample surface (for example with the assistance of a processing gas) or applying material of the second particle beam (for example of an ion beam) or material which was deposited by feeding in a gas and with the aid of the first particle beam,
rotating the sample carrier into the second position; and
analyzing the sample surface using the second particle beam.

In particular, the method according to the system described herein provides for the sample carrier to be moved before processing of the sample surface along the rotation axis. This is intended to ensure that the sample surface is always arranged at the same working distance relative to the first particle beam column and/or relative to the second particle beam column when the sample surface of the sample is processed or analyzed. In this respect, reference is also made to further above.

BRIEF DESCRIPTION OF THE DRAWINGS

Embodiments of the system described herein are explained in greater detail below on the basis of the figures, which are briefly described as follows.

DETAILED DESCRIPTION OF VARIOUS EMBODIMENTS

Figure 1:
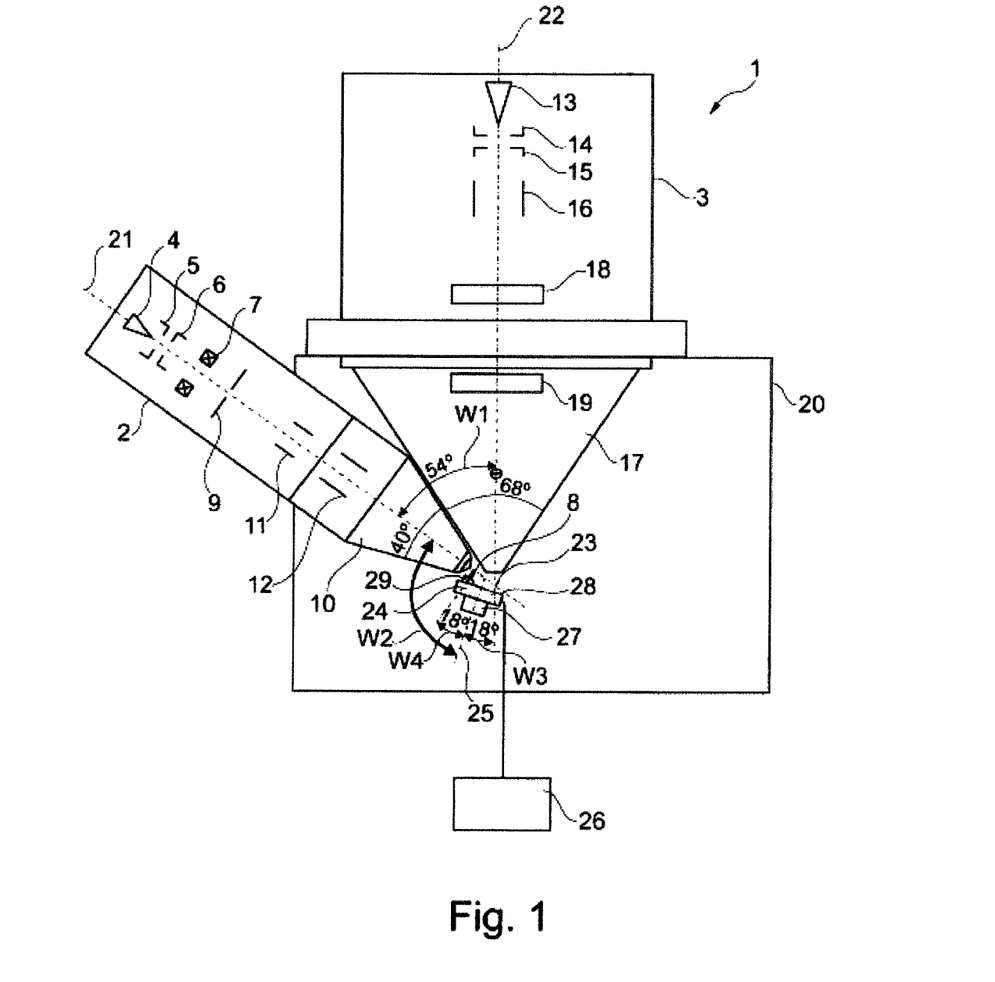
FIG. 1 shows a schematic illustration of a particle beam device with a sample carrier in a first position according to an embodiment of the system described herein.

FIG. 1 shows a schematic illustration of a particle beam device 1, which is provided with a first particle beam column 2 in the form of an ion beam column and with a second particle beam column 3 in the form of an electron beam column. It is explicitly pointed out that the system described herein is not restricted to the aforementioned configuration. Rather, the first particle beam column 2 can also be embodied as an electron beam column and the second particle beam column 3 can be embodied as an ion beam column. In a further embodiment, both the first particle beam column 2 and the second particle beam column 3 are respectively embodied as an electron beam column. An in turn further exemplary embodiment provides for both the first particle beam column 2 and the second particle beam column 3 respectively to be embodied as an ion beam column.

The first particle beam column 2 has an ion source 4, which is embodied for example as a liquid metal ion source or gas ion source. The ion source 4 generates ions that form an ion beam in the first particle beam column 2. The ions are accelerated to a predeterminable potential using an ion beam electrode 5 and subsequently guided through a first condenser lens 6.

In the illustrated embodiment of the first particle beam column 2, provision is firstly made for generating only one individual type of ions. The ions are embodied as ionized atoms or as ionized molecules. By way of example, only gallium ions, only silicon ions or only gold ions are generated. However, the system described herein is not restricted to the aforementioned types of ions. Rather, it is possible to use any type of ion suitable for processing and/or for analyzing a sample.

A further embodiment of the first particle beam column 2 secondly provides for generating a variety of ions having different masses and/or different numbers of elementary charges using the ion source 4. Thus, by way of example, provision is made for the variety of ions to comprise or contain ions of a plurality of the following elements: gallium (Ga), silicon (Si), chromium (Cr), iron (Fe), cobalt (Co), nickel (Ni), germanium (Ge), indium (In), tin (Sn), gold (Au), silver (Ag), lead (Pb), bismuth (Bi), neodymium (Nd), cesium (Cs) arsenic (As), helium (He), neon (Ne), argon (Ar) and xenon (Xe). The ions are once again embodied as ionized atoms or as ionized molecules (for example $AuSi^+$ or $AuSi^{2+}$). By way of example, this embodiment of ion generation provides for the first particle beam column 2 to have a Wien filter 7 disposed downstream of the first condenser lens 6—as seen from the ion source 4. The Wien filter 7 provides both an electric field and a magnetic field in such a way that ions having a very specific mass and/or having a very specific number of elementary charges can be selected from the variety of ions that form the ion beam. Only these selected ions remain in the ion beam and are then guided in the direction of a sample 8 to be processed and/or to be analyzed. The ions not selected are accordingly suppressed from the ion beam.

The ion beam is guided through an aperture 9 and focused onto the sample 8 using a first objective lens 10. A first electrode arrangement 11 and a second electrode arrangement 12 are used as a scanning device. The ion beam is scanned over the sample 8 using the first electrode arrangement 11 and the second electrode arrangement 12.

As already mentioned above, the second particle beam column 3 is embodied as an electron beam column. In the exemplary embodiment illustrated here, the second particle beam column 3 is embodied as a scanning electron microscope. The second particle beam column 3 has an electron source 13 that generates electrons which are extracted using a first electrode 14. The electrons are accelerated to a predeterminable potential using a second electrode 15. The electrons are subsequently guided through a second condenser lens 16, whereby an electron beam is shaped. The latter is focused onto the sample 8 using a second objective lens 17, which will be explained in even greater detail further below. Scanning electrodes (not illustrated) arranged at the second objective lens 17 ensure that the electron beam can be scanned over the sample 8.

When the electron beam impinges on the sample 8, interaction particles arise, in particular secondary electrons and backscattered electrons. These are detected using a first detector 18 and using a second detector 19 and are used for imaging. It is thus possible to image the surface of the sample 8. It is explicitly pointed out that the particle beam device 1 can have further detector devices.

Both the first particle beam column 2 and the second particle beam column 3 are arranged on a sample chamber 20 of the particle beam device 1. The first particle beam column 2 has a first beam axis 21. By contrast, the second particle beam column 3 has a second beam axis 22. In the exemplary embodiment illustrated here, the second beam axis 22 corresponds to the vertical. The first particle beam column 2 and the second particle beam column 3 are arranged on the sample chamber 20 in such a way that the first beam axis 21 and the second beam axis 22 form a first angle W1, which is different from 0° and 180°. By way of example, the first angle W1 is in the range of 15° to 80°, or in the range of 30° to 70°, or alternatively in the range of 45° to 60°. One embodiment provides for the first angle W1 to be approximately 54°. The first beam axis 21 and the second beam axis 22 intersect at a coincidence point 23, which will be discussed in even greater detail further below.

A sample carrier 24 is arranged in the sample chamber 20 of the particle beam device 1, said sample carrier being embodied symmetrically with respect to a rotation axis 25. The sample carrier 24 is embodied such that it is rotatable about the rotation axis 25. A control device 26 is provided for controlling the rotation of the sample carrier 24 about the rotation axis 25, said control device being connected to the sample carrier 24.

The sample carrier 24 has a movement device 27, by which the sample carrier 24 can be moved along the rotation axis 25. The movement device 27 therefore provides a translational movement of the sample carrier 24 along the rotation axis 25. In addition, it is possible that the sample carrier 24 can be moved using the movement device 27 in three directions (for example arranged perpendicular to one another) (for example along an x-axis, a y-axis and a z-axis). Each of these three directions extends along a respective translational axis along which the sample carrier 24 is movable.

The rotation axis 25 of the sample carrier 24 is oriented in such a way that it forms a second angle W2 with the first beam axis 21. The second angle W2 is different from 0° and 180°. By way of example, the second angle W2 is in the range of 45° to 160°, or in the range of 90° to 120° or else in the range of 100° to 110°. In the exemplary embodiment illustrated here, the second angle W2 is approximately 108°.

The rotation axis 25 forms an angle with the second beam axis 22 as well, namely the third angle W3. The third angle W3 is once again different from 0° and 180°. By way of example, the third angle W3 is in the range of 1° to 80°, or in the range of 10° to 60° or alternatively in the range of 15° to 30°. In the exemplary embodiment illustrated here, the third angle W3 is approximately 18°.

Figure 3:
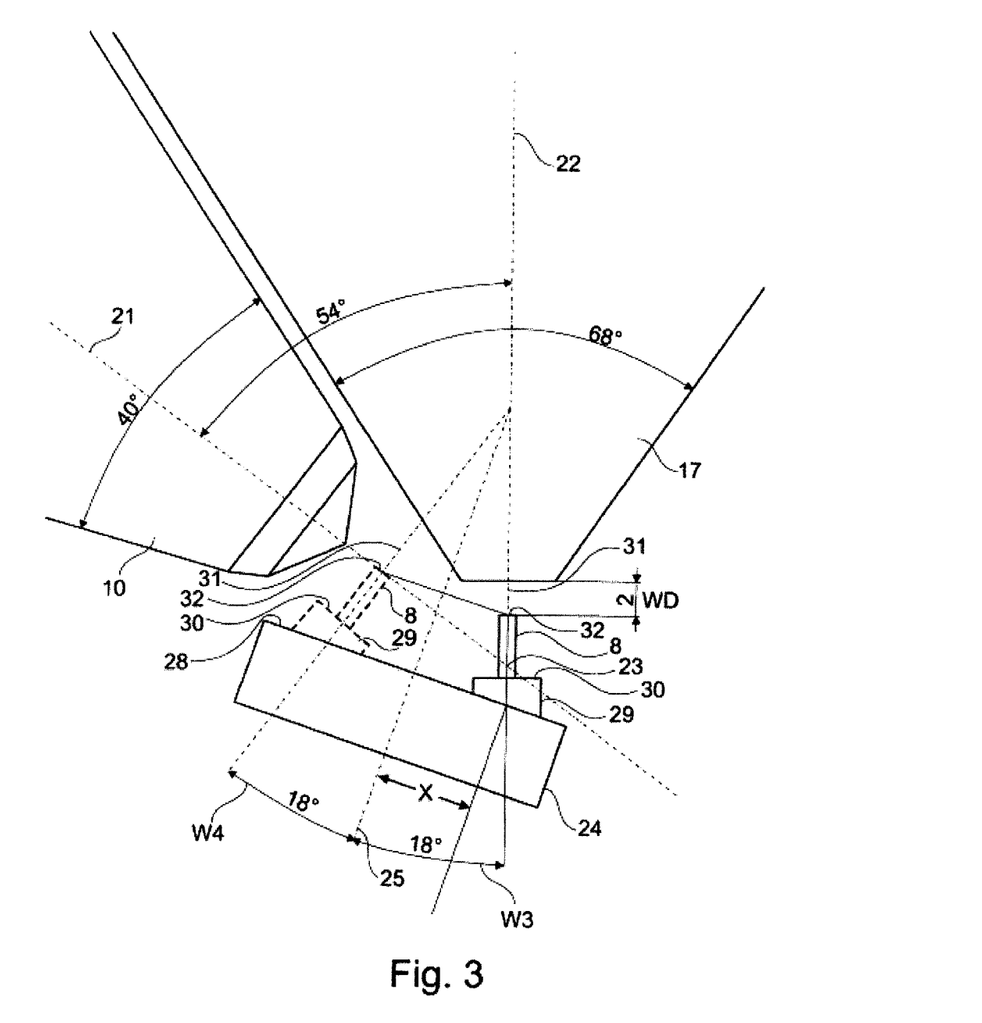
FIG. 3 shows a schematic illustration of the particle beam device according to FIGS. 1 and 2, wherein the illustration elucidates the first position and the second position.

A sample holder 29 is arranged on a sample carrier surface 28 of the sample carrier 24 (also cf. FIG. 3). In the exemplary embodiment illustrated here, the sample holder 29 and the sample carrier 24 are embodied as separate units. By way of example, the sample holder 29 is connected to the sample carrier 24 using a fixing device in the form of a screw connection. An alternative embodiment provides for the sample holder 29 to be integrally formed on the sample carrier 24.

In a further alternative embodiment it is provided that the sample holder 29 can be arranged and fixed at different distances X from the rotation axis 25 in the radial direction. As the distance X increases, both in the first position of the sample carrier 24 the distance between a sample surface 32 and the first objective lens 10 of the first particle beam column 2 decreases and in the second position of the sample carrier 24 the distance WD between the sample surface 32 and the second objective lens 17 of the second particle beam column 3 decreases (working distance WD). Using the radial positioning of the sample holder 29 on the sample carrier surface 28 of the sample carrier 24, the working distance WD can thus be set in order to enable the imaging properties (for example resolution) or working at low high voltages.

The sample holder 29 is provided with a receiving surface 30, which is arranged in inclined fashion with respect to the sample carrier surface 28. The receiving surface 30 has a second surface normal 31, which forms a fourth angle W4 with the rotation axis 25. In the exemplary embodiment illustrated in FIGS. 1 to 3, the fourth angle W4 is approximately 18°.

The sample 8 is arranged on the receiving surface 30 in such a way that the sample surface 32 is arranged parallel to the receiving surface 30. In this exemplary embodiment, the first surface normal of the sample surface 32 corresponds to the second surface normal 31. However, it is explicitly pointed out that the system described herein is not restricted to this embodiment. Rather, embodiments in which the sample surface 32 is not arranged parallel to the receiving surface 30 are also provided. However, these embodiments also provide for the sample surface 32 to be able to be oriented parallel or substantially parallel to the beam axis 21.

In the case of the particle beam system illustrated in FIG. 1, the following relations for the angles are fulfilled:

$$W3=(90°-W1)/2 \quad [1]$$

$$W2=90°+W3 \quad [2]$$

In the embodiment illustrated in FIG. 3, the sample holder 29 is embodied and arranged in an oriented fashion on the sample carrier 24 in such a way that the surface facing the second particle beam column 3 in the form of the receiving surface 30 of the sample holder 29, serving for receiving the sample 8, is oriented perpendicular to the second beam axis 22, that is to say that the surface normal to the surface facing the second particle beam column 3 is oriented parallel to the second beam axis 22.

Figure 2:
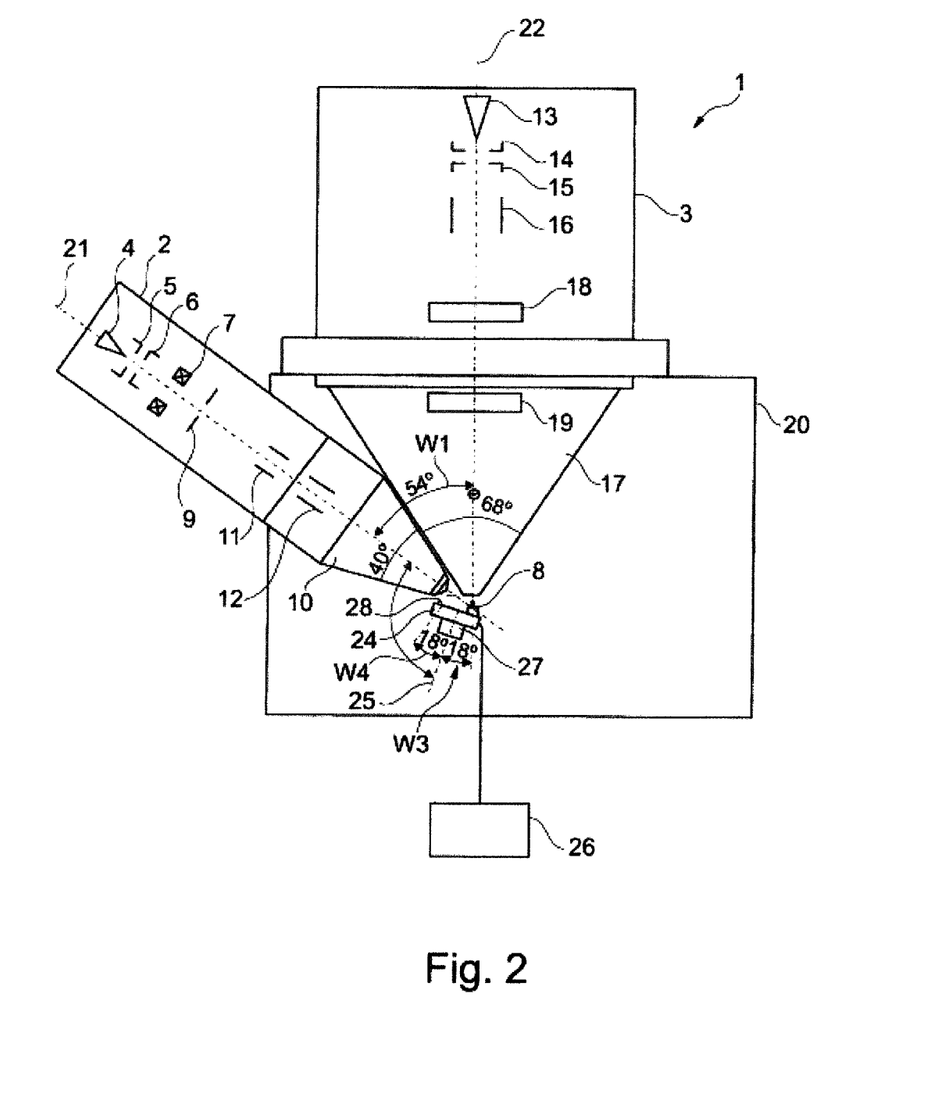
FIG. 2 shows a schematic illustration of the particle beam device according to FIG. 1, in which the sample carrier is in a second position.

FIG. 1 shows the sample carrier 24 in a first position. In this first position, the sample surface 32 of the sample 8 is oriented parallel to the first beam axis 21. FIG. 2 shows the particle beam device 1 in accordance with FIG. 1. Therefore, identical structural parts are provided with the same reference symbols. In contrast to FIG. 1, in FIG. 2 the sample carrier 24 is illustrated in a second position, in which the sample surface 32 of the sample 8 is oriented perpendicular to the second beam axis 22. FIG. 3 shows a simplified schematic illustration of the first position of the sample carrier 24 (illustrated by dashed lines) and of the second position of the sample carrier 24 (solid lines).

The method for which the particle beam device 1 is used will now be discussed below. Furthermore, the particular properties and the advantages of the system described herein will also be discussed in greater detail below.

Figure 4:
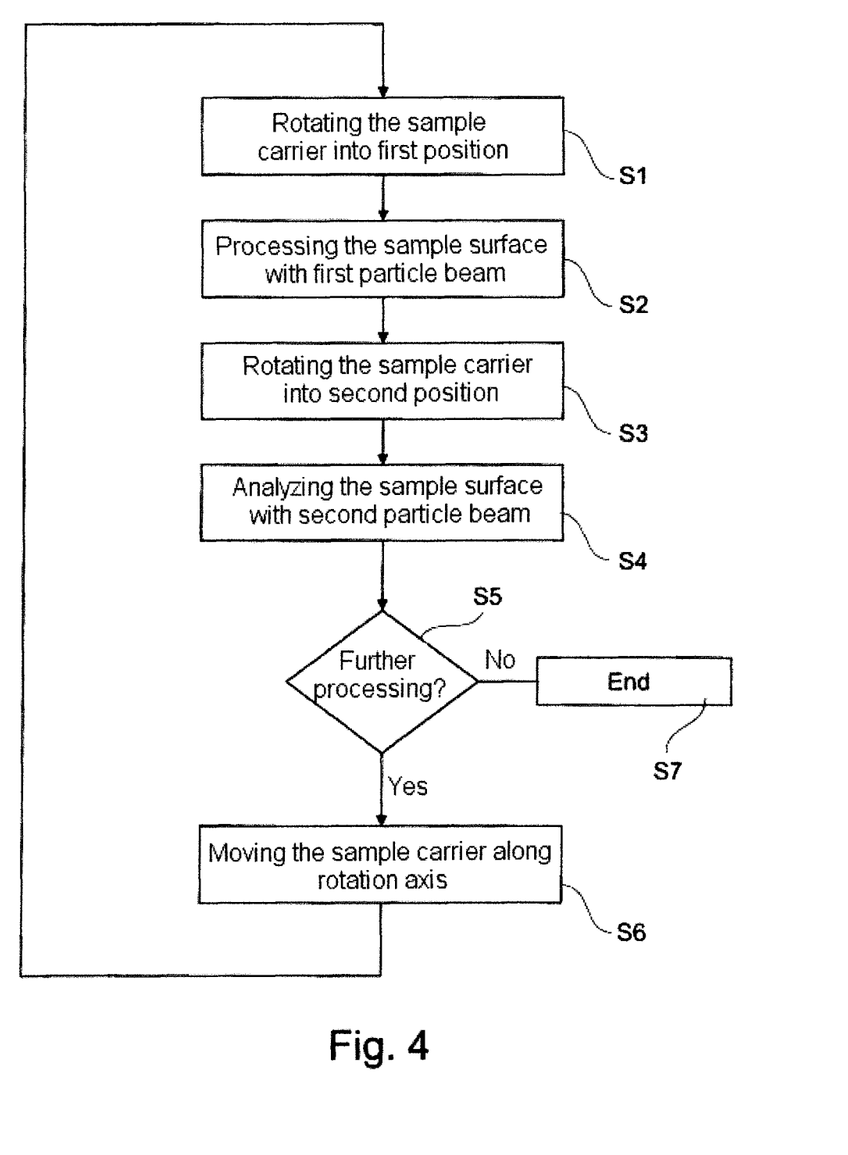
FIG. 4 shows a flow chart of a method for processing and/or for analyzing a sample using the particle beam device according to FIGS. 1 to 3.

An exemplary flow chart of method steps is illustrated in FIG. 4. In a step S1, the sample carrier 24 is brought into the first position in accordance with FIG. 1. In one embodiment, this is effected exclusively by the rotation of the sample carrier 24 about the rotation axis 25. In a further embodiment, the position of the sample carrier 24 can be set as necessary using the control device in such a way that the sample surface 32 is oriented parallel to the first beam axis 22.

In the first position, the sample surface 32 of the sample 8 is processed using the first particle beam (ion beam) (step S2). By way of example, in the first position, material is removed from the sample surface 32 or material is applied to the sample surface 32.

Afterward, the sample carrier 24 is brought from the first position into the second position (cf. FIGS. 2 and 3). This is effected exclusively by the rotation of the sample carrier 24 about the rotation axis 25 (step S3). As explained above, the sample surface 32 of the sample 8 in the second position is always oriented perpendicular or approximately perpendicular to the second beam axis 22. In the second position, the processed sample surface 32 is now analyzed using the second particle beam in the form of the electron beam (step S4). In particular, step S4 provides for the processed sample surface 32 to be imaged using the second particle beam. For this purpose, the first detector 18 and the second detector 19 detect interaction particles (for example secondary electrons and/or backscattered electrons), which arise when the electron beam impinges on the sample surface 32 as a result of the interaction of the electron beam with the sample surface 32. In addition or as an alternative thereto, provision is also made, for example, for detecting and evaluating interaction radiation (for example cathodoluminescence or x-ray radiation) which arises when the second particle beam impinges on the sample surface 32.

Afterward, a decision is made as to whether the sample 8 is to be processed and analyzed anew (step S5). If this is not the case, the method is ended in step S7. If this is the case, then, in a further step S6, the sample carrier 24 is moved using the movement device 27 along the rotation axis 25. Afterward, steps S1 to S5 are repeated.

The system described herein is thus suitable for a series examination of the sample 8. A processing and an analysis of the sample 8 in series are possible in a simple and rapid manner since the change between the first position and the second position of the sample carrier 24 can be effected by a rotation of the sample carrier 24 about the rotation axis 25. Since the sample surface 32 in the second position is oriented perpendicular to the second beam axis 22, good imaging properties are obtained. Movements other than the rotation of the sample carrier 24 about the rotation axis 25 are not absolutely necessary. However, in the exemplary embodiment illustrated in FIG. 4—as explained—step S6 provides for moving the sample carrier 24 and thus the sample 8 along the rotation axis 25. This translational movement can be chosen for example depending on the processing of the sample surface 32. A further embodiment can provide for the first position also to be set by a movement of the sample carrier 24 along the translational axes in addition and/or as an alternative to the abovementioned translational movement along the rotation axis 25.

If, by way of example, material is applied to the sample surface 32 or removed from the sample surface 32, the sample carrier 24 is moved along the rotation axis 25 and/or the translational axes in such a way that the sample surface 32, in the first position of the sample carrier 24, is at an identical first distance from the first end in the form of the first objective lens 10 of the first particle beam column (first working distance). In addition, the sample carrier 24 is moved in such a way that, in the second position of the sample carrier 24, an identical second distance WD from the second end in the form of the second objective lens 17 of the second particle beam column 3 (second working distance WD) is always assumed. Consequently, it is not absolutely necessary to perform for example a refocusing of the second particle beam onto the sample surface 32 after each processing of the sample surface 32. However, in one embodiment of the system described herein, the fact that a slight refocusing is nevertheless carried out is indeed not excluded.

The system described herein has the advantage that, using a single movement of the sample carrier 24, namely the rotation of the sample carrier 24 from the first position into the second position about the rotation axis 25, the sample surface 32 of the sample 8 can be oriented perpendicular to the second beam axis 22. Further movements are not absolutely necessary.

In the case of the particle beam device 1, the first working distance and/or the second working distance, in comparison with the prior art, are/is less than the distance between the coincidence point 23 and the first particle beam column 2 and/or the second particle beam column 3. The system described herein provides for processing and/or analyzing the sample surface 32 of the sample 8 not at the coincidence point 23, but rather at points which are arranged significantly closer to the first particle beam column 2 and/or the second particle beam column 3 than the coincidence point 23. As a result of this, a better resolution capability than in the case of the prior art is obtained in particular in the second position during an imaging of the sample surface 32 using the second particle beam.

By way of example, the first working distance is in the range of 0.5 mm to 12 mm, wherein the range limits of this range are concomitantly encompassed thereby. In particular, approximately 1.0 mm can be chosen as the first working distance. Furthermore, provision is made, for example, for the second working distance to be in the range of 0.5 mm to 5 mm, wherein here too, the range limits of the aforementioned range are concomitantly encompassed thereby. In particular, approximately 1.5 mm can be chosen as the second working distance. It is explicitly pointed out that the abovementioned values of the first working distance and of the second working distance should be understood merely by way of example and not in a restrictive manner. Rather, it is also possible to choose other values for at least one of the two working distances mentioned above.

On account of the smaller working distances possible in comparison with the prior art, the system described herein makes it possible that in the first position and/or in the second position of the sample carrier 24 imagings can be performed in which lower acceleration voltages than in comparison with the prior art can be used for particles of the first particle beam and/or particles of the second particle beam. By way of example, acceleration voltages of less than 750 V are provided in the system described herein using particles of the second particle beam. Even with such a low acceleration voltage, with the working distances which can be obtained with the system described herein, sufficiently good imagings can still be obtained. This is possible only with difficulty in the prior art, which likewise has the second particle beam column, for imagings of a sample surface arranged at the coincidence point.

The system described herein has been explained above on the basis of an exemplary embodiment wherein an electron beam column (second particle beam column 3) is used for the analysis of the sample surface 32. As an alternative thereto, in another embodiment of the system described herein, for the analysis of the sample surface 32 or of the sample 8, it is possible to use an ion column, in particular a device which is embodied as a gas field ion microscope, wherein the second particle beam is generated by gas atoms being ionized in the electrostatic field of an emission tip and the ions thus formed then being shaped into an ion beam that is then focused as an ion probe onto the sample surface 32.

The first particle beam column 2, which serves for processing the sample surface 32, can also be embodied as a gas field ion column. In this case, the second particle beam column 3, which serves for analyzing the sample surface 32, should be operated with ions having a relatively low atomic mass, such as helium ions, and the first particle beam column 2, which serves for processing the sample surface 32, should be operated with ions having a relatively larger atomic mass, such as argon ions, neon ions or krypton ions.

Various embodiments discussed herein may be combined with each other in appropriate combinations in connection with the system described herein. Additionally, in some instances, the order of steps in the flowcharts, flow diagrams and/or described flow processing may be modified, where appropriate. Further, various aspects of the system described herein may be implemented using software, hardware, a combination of software and hardware and/or other computer-implemented modules or devices having the described features and performing the described functions. Software implementations of the system described herein may include executable code that is stored in a computer readable medium and executed by one or more processors. The computer readable medium may include a computer hard drive, ROM, RAM, flash memory, portable computer storage media such as a CD-ROM, a DVD-ROM, a flash drive and/or other drive with, for example, a universal serial bus (USE) interface, and/or any other appropriate tangible or non-transitory computer readable medium or computer memory on which executable code may be stored and executed by a processor. The system described herein may be used in connection with any appropriate operating system.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

What is claimed is:

1. A particle beam device, comprising:
   at least one first particle beam column which has a first beam axis and which is designed for generating a first particle beam;
   at least one second particle beam column which has a second beam axis and which is designed for generating a second particle beam, wherein the first particle beam column and the second particle beam column are arranged with respect to one another in such a way that the first beam axis and the second beam axis form a first angle which is different from 0° and 180°; and
   at least one sample carrier which is rotatable about a rotation axis, wherein the rotation axis forms a second angle with the first beam axis, wherein the rotation axis forms a third angle with the second beam axis, wherein both the second angle and the third angle are different from 0° and 180°, wherein at least one sample to be processed or to be analyzed is arrangeable on the sample carrier, wherein the sample carrier is arranged at a first position at which a predominate sample surface of the at least one sample is exposed or processed using the first particle beam, wherein the sample carrier is configured to be rotatable from the first position into a second position in which the predominate sample surface is oriented perpendicular to the second beam axis, wherein the predominate sample surface in the first position is oriented parallel to the first beam axis, wherein, in the first position, a predominate surface normal of the predominate sample surface is perpendicular to the first beam axis and, in the second position, the predominate surface normal of the predominate sample surface is parallel to the second beam axis, wherein the first beam axis and the second beam axis intersect at a coincidence point, wherein the first beam axis, the second beam axis and the rotation axis are arranged substantially entirely in a single plane, and wherein at least one of the following is further provided:
  (i) in the first position, a distance between the coincidence point and the first particle beam column is greater than a distance between the predominate sample surface and the first particle beam column; or
  (ii) in the second position, a distance between the coincidence point and the second particle beam column is greater than a distance between the predominate sample surface and the second particle beam column.

2. The particle beam device according to claim 1, wherein the predominate surface normal of the predominate sample surface in the first position forms a fourth angle with the rotation axis, said fourth angle being different from 0° and 180°.

3. The particle beam device according to claim 1, wherein the sample carrier is rotatable from the second position into the first position.

4. The particle beam device according to claim 2, wherein the at least one sample is arranged at a predeterminable distance from the rotation axis of the sample carrier on the sample carrier in order to define a first working distance between the predominate sample surface and the first particle beam column and in order to define a second working distance between the predominate sample surface and the second particle beam column.

5. The particle beam device according to claim 1, further comprising:
  a movement device for moving the sample carrier along the rotation axis.

6. The particle beam device according to claim 5, further comprising:
  at least one control device for controlling at least one of: the movement device or a rotation of the sample carrier about the rotation axis.

7. The particle beam device according to claim 2, wherein the sample carrier has at least one sample holder, wherein the sample holder has a receiving surface, on which the sample is arranged, wherein the predominate surface normal of the predominate sample surface is a first surface normal and wherein the receiving surface has a second surface normal, wherein the second surface normal forms a fifth angle with the rotation axis, said fifth angle being different from 0° and 180°.

8. The particle beam device according to claim 7, wherein the first predominate surface normal and the second predominate surface normal are oriented parallel to one another or are identical.

9. The particle beam device according to claim 1, wherein the particle beam device has one of the following features:
  (i) the first angle is in the range of 15° to 80°;
  (ii) the first angle is in the range of 30° to 70°; or
  (iii) the first angle is in the range of 45° to 60°.

10. The particle beam device according to claim 1, wherein the particle beam device has one of the following features:
  (i) the second angle is in the range of 45° to 160°;
  (ii) the second angle is in the range of 90° to 120°; or
  (iii) the second angle is in the range of 100° to 110°.

11. The particle beam device according to claim 1, wherein the particle beam device has one of the following features:
  (i) the third angle is in the range of 1° to 80°;
  (ii) the third angle is in the range of 10° to 60°; or
  (iii) the third angle is in the range of 15° to 30°.

12. The particle beam device according to claim 1, wherein the third angle corresponds to half of the value by which the first angle deviates from 90°, and wherein the second angle corresponds to the sum of 90° and half of the value by which the first angle deviates from 90°.

13. The particle beam device according to claim 1, wherein the sample carrier and the sample holder are embodied in integral fashion.

14. The particle beam device according to claim 1, wherein the particle beam device has one of the following features:
  (i) the first particle beam column is embodied as an ion beam column and the second particle beam column is embodied as an electron beam column;
  (ii) the first particle beam column is embodied as an electron beam column and the second particle beam column is embodied as an ion beam column;
  (iii) the first particle beam column is embodied as an electron beam column and the second particle beam column is embodied as an electron beam column; or
  (iv) the first particle beam column is embodied as an ion beam column and the second particle beam column is embodied as an ion beam column.

15. The particle beam device according to claim 1, wherein the particle beam device has at least one of the following features:
  (i) the first particle beam column has a first beam generator for generating a first particle beam and a first objective lens for focusing the first particle beam onto the sample; or
  (ii) the second particle beam column has a second beam generator for generating a second particle beam and a second objective lens for focusing the second particle beam onto the sample.

16. The particle beam device according to claim 1, further comprising:
  at least one detection device for detecting interaction particles or interaction radiation, which arise as a result of interactions with the sample by at least one of: the first particle beam or the second particle beam.

17. A method for processing or analyzing at least one sample, wherein a particle beam device is used in the method, wherein the method comprises:
  rotating a sample carrier of the particle beam device about a rotation axis into a first position;
  processing a predominate sample surface of the at least one sample using a first particle beam of the particle beam device;
  rotating the sample carrier about the rotation axis into a second position; and
  analyzing the predominate sample surface using a second particle beam of the particle beam device,
  wherein the particle beam device includes:
    at least one first particle beam column which has a first beam axis and which generates the first particle beam;
    at least one second particle beam column which has a second beam axis and which generates the second particle beam, wherein the first particle beam column and the second particle beam column are arranged with respect to one another in such a way that the first beam axis and the second beam axis form a first angle which is different from 0° and 180°; and
the sample carrier which is rotatable about the rotation axis, wherein the rotation axis forms a second angle with the first beam axis, wherein the rotation axis forms a third angle with the second beam axis, wherein both the second angle and the third angle are different from 0° and 180°, wherein the at least one sample to be processed or analyzed is arrangeable on the sample carrier, wherein the sample carrier is arranged at the first position at which the predominate sample surface of the at least one sample is exposed or processed using the first particle beam, wherein the sample carrier is configured to be rotatable from the first position into the second position, in which the predominate sample surface is oriented perpendicular to the second beam axis, wherein the predominate sample surface in the first position is oriented parallel to the first beam axis, wherein, in the first position, a predominate surface normal of the predominate sample surface is perpendicular to the first beam axis and, in the second position, the predominate surface normal of the predominate sample surface is parallel to the second beam axis, wherein the first beam axis and the second beam axis intersect at a coincidence point, and wherein the first beam axis, the second beam axis and the rotation axis are arranged substantially entirely in a single plane.

18. The method according to claim 17, wherein the sample carrier is moved before the processing of the predominate sample surface along the rotation axis.

19. The method according to claim 17, wherein at least one of the following is further provided:
 (i) in the first position, a distance between the coincidence point and the first particle beam column is greater than a distance between the predominate sample surface and the first particle beam column; or
 (ii) in the second position, a distance between the coincidence point and the second particle beam column is greater than a distance between the predominate sample surface and the second particle beam column.

* * * * *